US009583622B2

(12) United States Patent
Zhu et al.

(10) Patent No.: US 9,583,622 B2
(45) Date of Patent: Feb. 28, 2017

(54) SEMICONDUCTOR STRUCTURE AND METHOD FOR MANUFACTURING THE SAME

(75) Inventors: Huilong Zhu, Poughkeepsie, NY (US); Zhijiong Luo, Poughkeepsie, NY (US); Haizhou Yin, Poughkeepsie, NY (US); Qingqing Liang, Lagrangeville, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/407,263

(22) PCT Filed: Jul. 6, 2012

(86) PCT No.: PCT/CN2012/078317
§ 371 (c)(1),
(2), (4) Date: Dec. 11, 2014

(87) PCT Pub. No.: WO2013/185397
PCT Pub. Date: Dec. 19, 2013

(65) Prior Publication Data
US 2015/0187942 A1    Jul. 2, 2015

(30) Foreign Application Priority Data

Jun. 12, 2012 (CN) .......................... 2012 1 0192523

(51) Int. Cl.
*H01L 27/12* (2006.01)
*H01L 29/78* (2006.01)
(Continued)

(52) U.S. Cl.
CPC ...... *H01L 29/7849* (2013.01); *H01L 21/0245* (2013.01); *H01L 21/02513* (2013.01);
(Continued)

(58) Field of Classification Search
CPC .......... H01L 29/7849; H01L 29/66568; H01L 29/161; H01L 29/16; H01L 29/0653;
(Continued)

(56) References Cited

U.S. PATENT DOCUMENTS 6,376,312 B1   4/2002  Yu
8,124,470 B1 * 2/2012  Bedell ............... H01L 21/76283
                                              257/E21.445

(Continued)

FOREIGN PATENT DOCUMENTS

CN        1623238 A      6/2005
CN        1822388 A      8/2006
CN      101000884 A      7/2007

OTHER PUBLICATIONS

International Search Report and Written Opinion for PCT Application No. PCT/CN2012/078317, dated Mar. 28, 2013, 14 pages.

*Primary Examiner* — Trung Q Dang
*Assistant Examiner* — Wasiul Haider
(74) *Attorney, Agent, or Firm* — Westman, Champlin & Koehler, P.A.

(57) ABSTRACT

The present invention discloses a semiconductor structure and a method for manufacturing the same, which comprises providing a substrate, and forming a stress layer, a buried oxide layer, and an SOI layer on the substrate; forming a doped region of the stress layer arranged in a specific position in the stress layer; forming an oxide layer and a nitride layer on the SOI layer, and forming a first trench that etches the nitride layer, the oxide layer, the SOI layer, and the buried oxide layer, and stops on the upper surface of the stress layer, and exposes at least part of the doped region of the stress layer; forming a cavity by wet etching through the first trench to remove the doped region of the stress layer; forming a polycrystalline silicon region of the stress layer and a second trench by filling the cavity with polycrystalline
(Continued)

silicon and etching back; forming an isolation region by filling the second trench. The semiconductor structure and the method for manufacturing the same disclosed in the present invention provide a favorable stress for the channel of the semiconductor device by introducing a stress layer and a stress induced zone set at specific positions depending on device type to help improving the performance of the semiconductor device.

16 Claims, 11 Drawing Sheets

(51) Int. Cl.
| | |
|---|---|
| H01L 29/66 | (2006.01) |
| H01L 29/732 | (2006.01) |
| H01L 29/737 | (2006.01) |
| H01L 29/786 | (2006.01) |
| H01L 21/02 | (2006.01) |
| H01L 21/265 | (2006.01) |
| H01L 21/306 | (2006.01) |
| H01L 21/324 | (2006.01) |
| H01L 21/762 | (2006.01) |
| H01L 29/04 | (2006.01) |
| H01L 29/06 | (2006.01) |
| H01L 29/16 | (2006.01) |
| H01L 29/161 | (2006.01) |

(52) U.S. Cl.
CPC ...... *H01L 21/265* (2013.01); *H01L 21/30604* (2013.01); *H01L 21/324* (2013.01); *H01L 21/76224* (2013.01); *H01L 21/76254* (2013.01); *H01L 29/04* (2013.01); *H01L 29/0653* (2013.01); *H01L 29/16* (2013.01); *H01L 29/161* (2013.01); *H01L 29/66242* (2013.01); *H01L 29/66272* (2013.01); *H01L 29/66568* (2013.01); *H01L 29/66772* (2013.01); *H01L 29/732* (2013.01); *H01L 29/7371* (2013.01); *H01L 29/78654* (2013.01)

(58) Field of Classification Search
CPC ......... H01L 29/78654; H01L 29/66772; H01L 29/66272; H01L 29/66242; H01L 29/7371; H01L 29/732; H01L 21/265; H01L 21/76224; H01L 21/0245; H01L 21/76254; H01L 21/02513; H01L 21/30604; H01L 21/324
See application file for complete search history.

(56) References Cited

U.S. PATENT DOCUMENTS

| | | | |
|---|---|---|---|
| 2004/0075142 A1* | 4/2004 | Matsuhashi | H01L 27/1203 257/347 |
| 2006/0022270 A1* | 2/2006 | Boyd | H01L 21/76283 257/351 |
| 2008/0217727 A1* | 9/2008 | Kjar | H01L 21/765 257/499 |
| 2008/0283927 A1* | 11/2008 | Hierlemann | H01L 21/823807 257/369 |
| 2009/0227078 A1* | 9/2009 | Chen | H01L 21/823807 438/199 |
| 2011/0306170 A1* | 12/2011 | Wang | H01L 21/32155 438/197 |
| 2011/0309333 A1* | 12/2011 | Cheng | B82Y 10/00 257/24 |
| 2012/0132977 A1* | 5/2012 | Seshita | H03K 3/02 257/316 |

* cited by examiner

SEMICONDUCTOR STRUCTURE AND METHOD FOR MANUFACTURING THE SAME

CROSS-REFERENCE TO RELATED APPLICATION

This application is a national stage application, filed under 35 U.S.C. §317, of PCT Application No. PCT/CN2012/078317, filed on Jul. 6, 2012, entitled "SEMICONDUCTOR STRUCTURE AND METHOD FOR MANUFACTURING THE SAME," which claims priority to Chinese Patent Application No. 201210192523.1, filed on Jun. 12, 2012, all of which is incorporated herein by reference in its entirety.

TECHNICAL FIELD

The present disclosure relates to the field of semiconductor, and in particular, to a semiconductor structure and a method for manufacturing the same.

BACKGROUND OF THE INVENTION

With the development of manufacturing technology of semiconductor devices, integrated circuits with higher performance and more functionalities require greater element density, smaller spaces between various components and elements, and smaller dimensions and sizes for individual elements. Hence the control over processes is quite stringent during manufacturing processes of semiconductor devices.

Semiconductor devices achieve greater integration degree through proportional scaling down, and the channel length of a MOS transistor is also shortened proportionally. However, when the channel length of the MOS transistor becomes very short, the so-called Short Channel Effects (SCsE) and the Drain-Induced Barrier Lowering (DIBL) effect may set serious obstacles for miniaturization of semiconductor devices.

Due to the fact that Short Channel Effects (SCEs) may lower device performance and even cause failure of devices, thus reducing SCEs is an important issue in the research and manufacturing of semiconductor devices. Internal mechanical stress of semiconductor devices is widely used to adjust performance of devices. SCEs can be improved by applying a stress to the channel.

Usually the method of applying a stress may manipulate in the source/drain (S/D) regions in order to form tensile or compressive stress. For example, in general silicon technology, the transistor channel is oriented along the silicon {110}. In this configuration, when compressive stress is applied to the channel along the channel length direction and/or tensile stress is applied to the channel along the direction perpendicular to the channel, mobility of holes will increase; whereas when tensile stress is applied to the channel along the channel length direction and/or compressive stress is applied to the channel along the direction perpendicular to the channel, mobility of electrons will increase. Therefore introducing stress into channel regions of semiconductor devices can enhance device performance.

Using Silicon On Insulator (SOI) substrate in place of silicon substrate may also achieve the effects of reducing SCE and enhancing device performance. SOI technology introduces a buried oxide layer between the top silicon layer and the substrate bulk silicon layer. By forming a semiconductor film on an insulator, SOI materials possess some incomparable advantages over bulk silicon: dielectric isolation of components in integrated circuits can be achieved so as to eliminate the parasitic latch-up effect in bulk silicon CMOS circuits; and integrated circuits made of these materials have multiple advantages such as small parasitic capacitance, high integration density, high speed, simple processes and reduced SCE, and are especially suitable for low voltage and low power consumption circuits. Therefore, SOI may become a mainstream technology for deep sub-micron low voltage and low power consumption integrated circuits.

At the same time, the heterostructure of SOI provides opportunities for the construction of ultra-thin silicon bulk devices. Ultra-thin SOI provides an option for controlling Short Channel Effects by the electrostatic barrier established by the silicon-dielectric interface.

Currently, there exists a technique that a ground layer is formed in the ultra-thin BOX layer of an ultra-thin SOI MOS transistor (Ultrathin-SOI MOSFET) to reduce Short Channel Effects (SCE), and to control power consumption. However, it is very difficult to apply a larger stress to such devices so as to improve device performance.

SUMMARY OF THE DISCLOSURE

The purpose of the present disclosure is to provide a semiconductor structure and a method for manufacturing the same to increase stress, to effectively control the short channel effects, and to improve the device performance.

According to one aspect of the present disclosure, the present disclosure provides a method for manufacturing a semiconductor structure, which comprises:
a) Providing a substrate, and sequentially forming a stress layer, a buried oxide layer, and an SOI layer on the substrate;
b) Forming a doped region of the stress layer arranged in a specific position in the stress layer depending on a type of a semiconductor device to be formed;
c) Sequentially forming an oxide layer and a nitride layer on the SOI layer, and forming a first trench that penetrates the nitride layer, the oxide layer, the SOI layer, and the buried oxide layer and stops on the upper surface of the stress layer, wherein the first trench exposes at least part of the doped region of the stress layer;
d) Forming a cavity by etching through the first trench to remove the doped region of the stress layer;
e) Forming a polycrystalline silicon region of the stress layer and a second trench by filling the cavity with polycrystalline silicon and etching back;
f) Forming an isolation region by filling the second trench.

Correspondingly, the present disclosure also provides a semiconductor structure, which comprises a substrate, a stress layer, a buried oxide layer, an SOI layer, an S/D region, a polycrystalline silicon region of the stress layer, a ground layer and a gate stack, wherein:

The gate stack is formed on the SOI layer;

The S/D region is formed in the SOI layer, and is located on both sides of the gate stack;

The stress layer, the buried oxide layer, and the SOI layer are formed sequentially on the substrate;

The polycrystalline silicon region of the stress layer is located in the stress layer, and on both sides of the gate stack or below the gate stack depending on the device type of the semiconductor structure.

In the semiconductor structure and the method for manufacturing the same in the present disclosure, an ultra-thin SOI substrate is provided, and a ground layer is formed in the stress layer. It provides a favorable stress for the channel of the semiconductor device by introducing a ground layer to help improving performance of semiconductor devices.

BRIEF DESCRIPTION OF THE DRAWINGS

Other features, objectives and advantages of the present disclosure will become more apparent after reading the detailed description of the non-limiting embodiment with reference to the following attached drawings, in which:

FIGS. 2-11(b) are schematic cross-sectional views of various stages of manufacturing the semiconductor structure following the processes illustrated in FIG. 1 according to the present disclosure.

The same or similar reference numbers in the attached drawings represent the same or similar parts.

DETAILED DESCRIPTION

To better clarify the objectives, technical solutions and advantages of the present disclosure, exemplary embodiments of the present disclosure will be described below in detail together with the attached drawings.

Exemplary embodiments of the present disclosure will be described in detail below. The examples of the embodiments are illustrated in the attached drawings, and the same or similar reference numbers refer to the same or similar elements or the elements with the same or similar functions throughout the drawings. The embodiment described below with reference to the drawings is only exemplary for explaining the present disclosure, and cannot be considered as limiting the present disclosure.

The following disclosure provides many different embodiments or examples to achieve different structures of the present disclosure. In order to simplify the disclosure of the present disclosure, the components and configurations of illustrative embodiments will be described herein. Certainly, they are only examples, and are not intended to limit the present disclosure. In addition, the reference numbers and/or letters may be repeated in different examples of the present disclosure. This repetition is only for simplification and clarity, and does not indicate any relationship between various embodiments and/or configurations discussed. In addition, the present disclosure provides various examples of processes and materials, but those skilled in the art may appreciate the application and applicability of other processes and/or materials. Further, the structure described below of a first feature "on" a second feature may include an embodiment in which the first and second features are in direct contact, and may also include an embodiment in which additional features may be formed between the first and second features so that the first and second features may not be in direct contact. It should be noted that the components shown in the attached drawings are not necessarily drawn to scale. Descriptions of well-known components and processing techniques are omitted in the present disclosure to avoid unnecessarily limiting the present disclosure.

Figure 1:
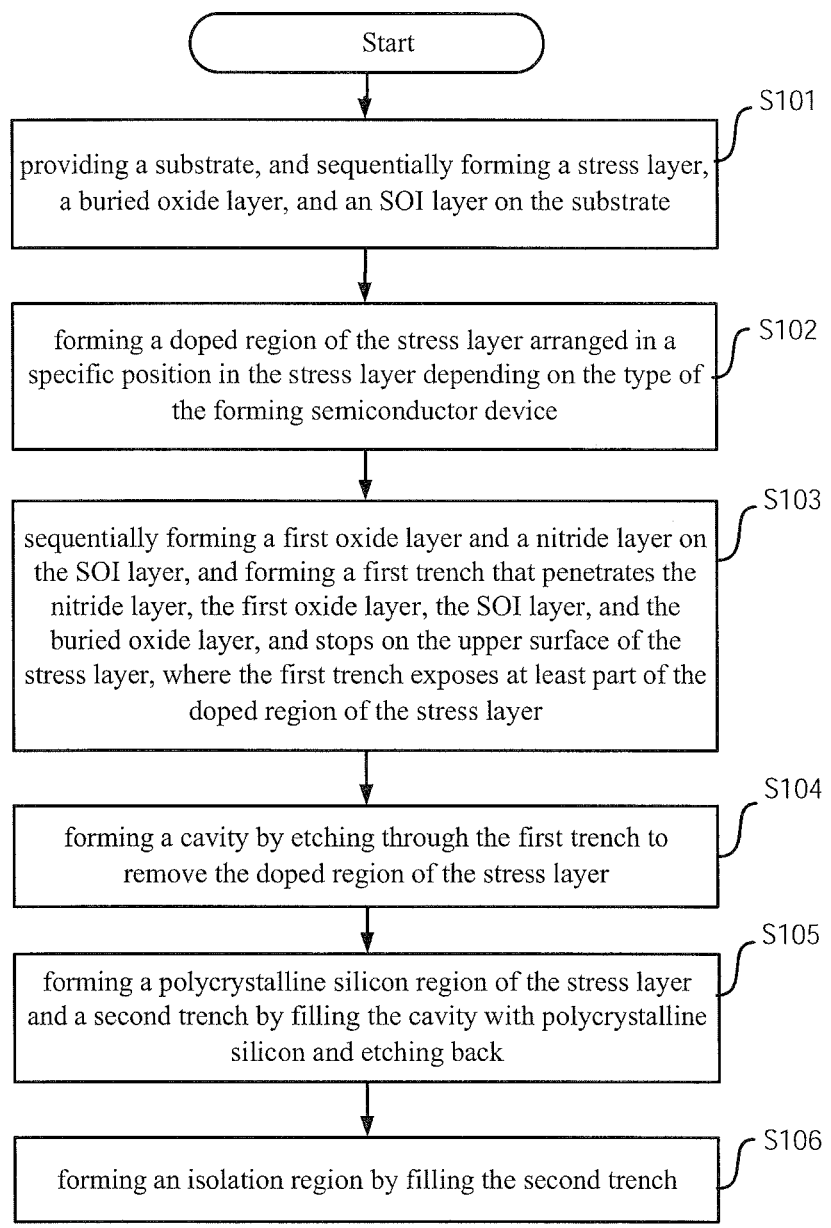
FIG. 1 is a schematic flow chart of a method for manufacturing a semiconductor structure according to an embodiment of the present disclosure.

Referring to FIG. 1, FIG. 1 is a schematic flow chart of a method for manufacturing a semiconductor structure according to an embodiment of the present disclosure. The method comprises:

Step S101, providing a substrate, and sequentially forming a stress layer, a buried oxide layer and an SOI layer on the substrate;

Step S102, forming a doped region of the stress layer in a specific position in the stress layer depending on the type of the semiconductor device to be formed;

Step S103, sequentially forming an oxide layer and a nitride layer on the SOI layer, and forming a first trench that penetrates the nitride layer, the oxide layer, the SOI layer, and the buried oxide layer and stops on the upper surface of the stress layer, where the first trench exposes at least part of the doped region of the stress layer;

Step S104, forming a cavity by etching through the first trench to remove the doped region of the stress layer;

Step S105, forming a polycrystalline silicon region of the stress layer and a second trench by filling the cavity with polycrystalline silicon and etching back;

Step S106, forming an isolation region by filling the second trench.

In combination with FIG. 2 to FIG. 11(b), detailed descriptions of step S101 to step S106 are given below. FIG. 2 to FIG. 11(b) are schematic cross-sectional views of various stages of a method for manufacturing the semiconductor structure following the processes illustrated in FIG. 1 according to the present disclosure. It should be noted that the attached drawings of various exemplary embodiments of the present disclosure are only for illustration purposes. Therefore they are not necessarily drawn to scale.

Figure 2:
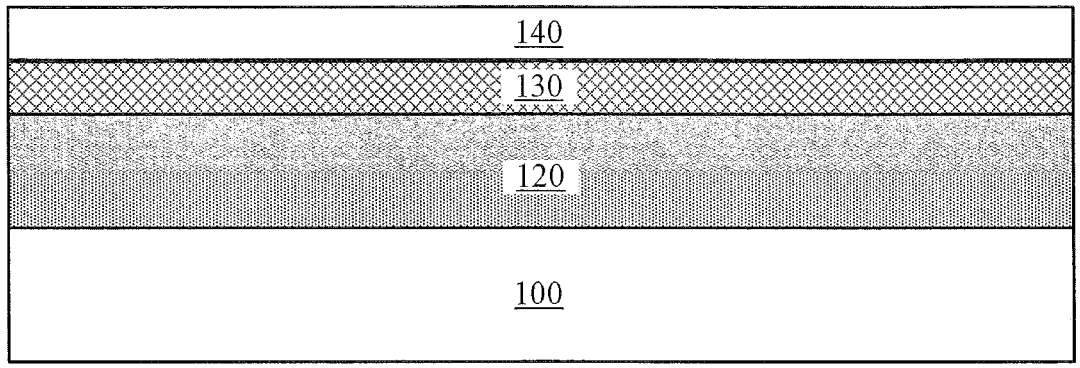
Figure 3:
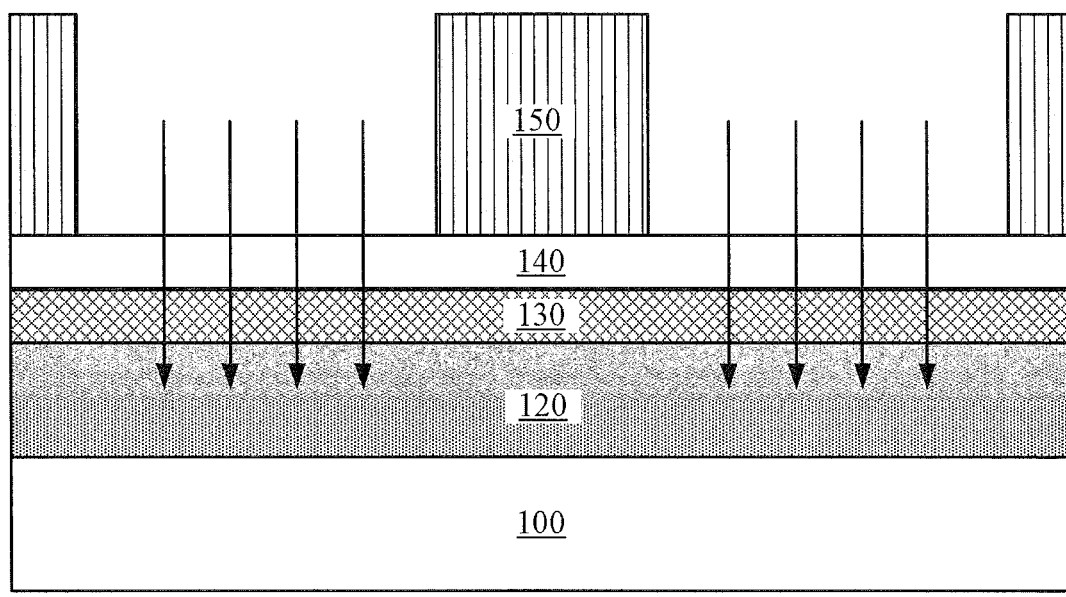
Figure 3:
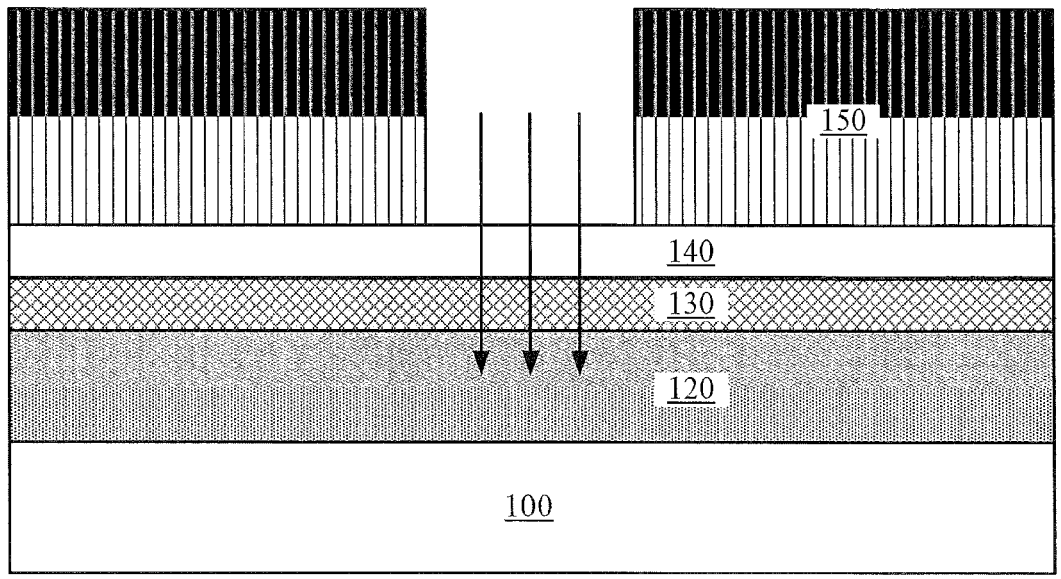
Figure 4:
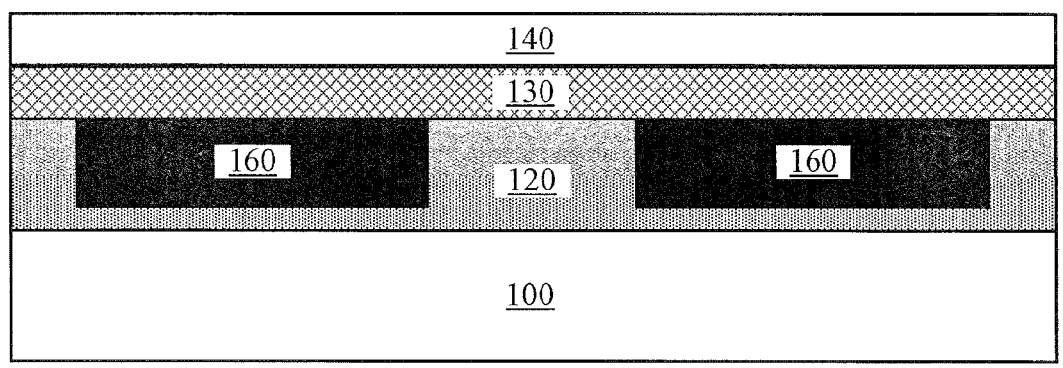
Figure 4:
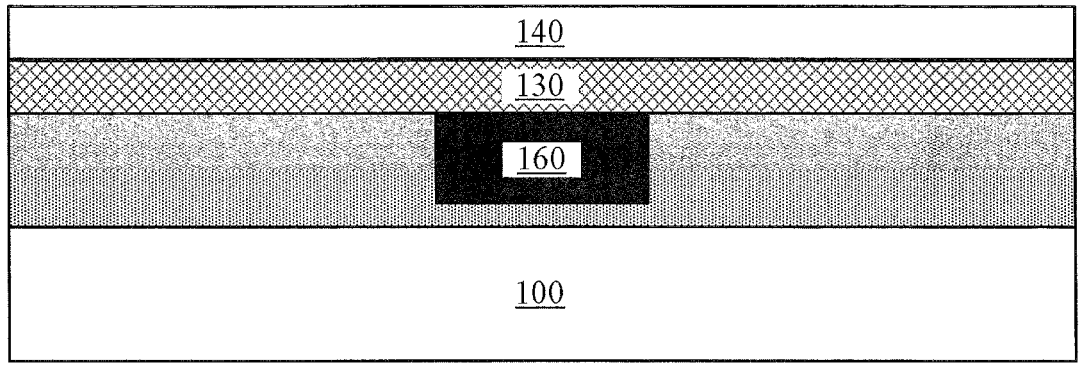
Figure 5:
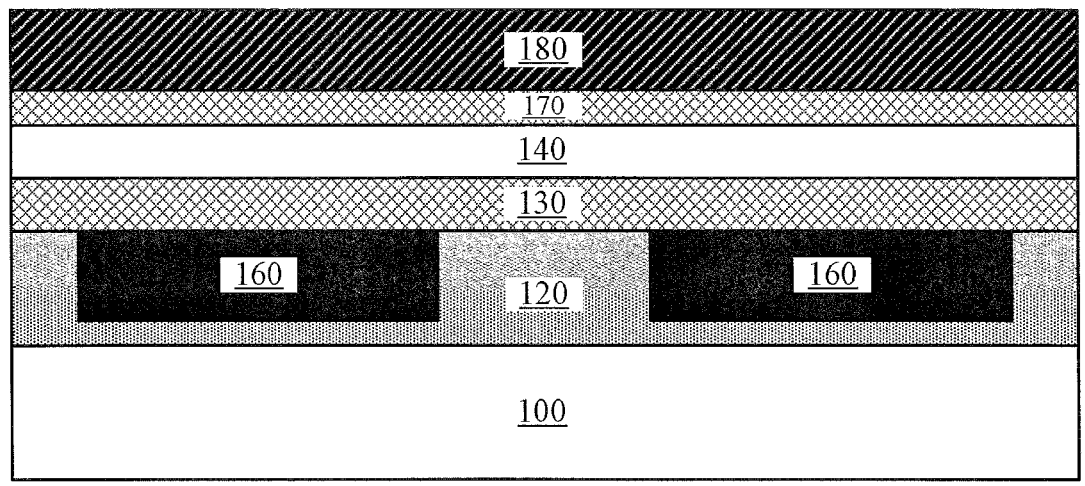
Figure 5:
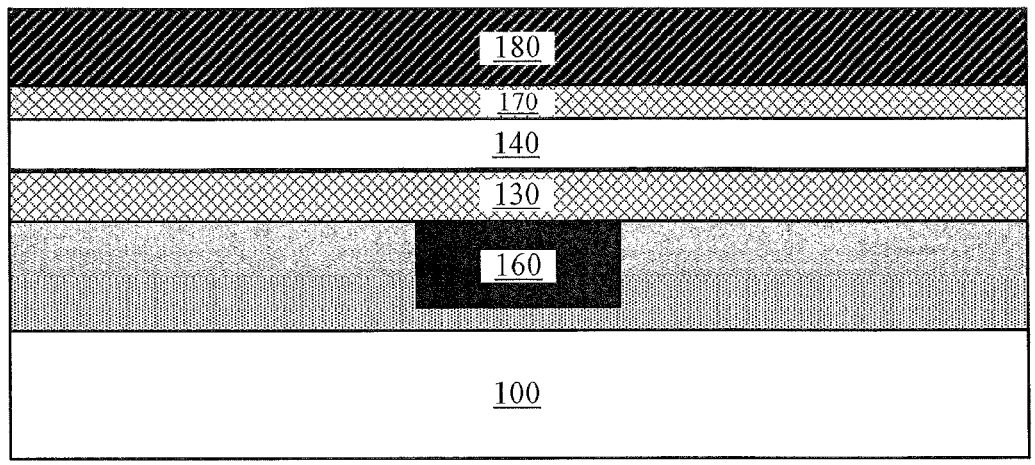
Figure 6:
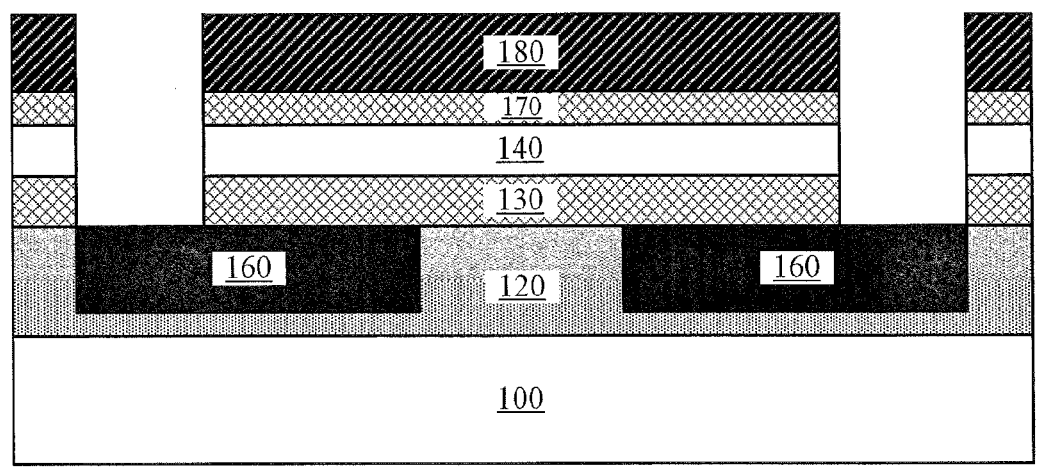
Figure 6:
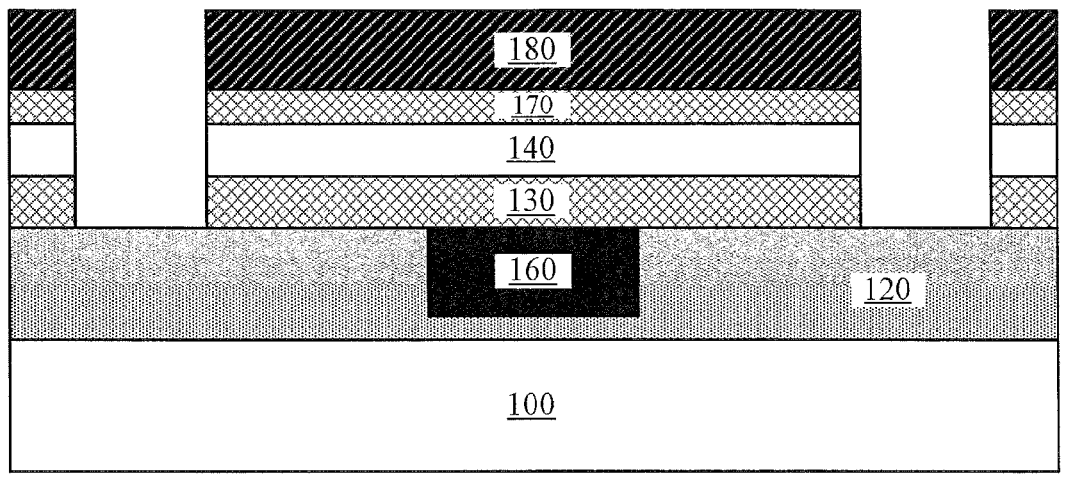
Figure 6:
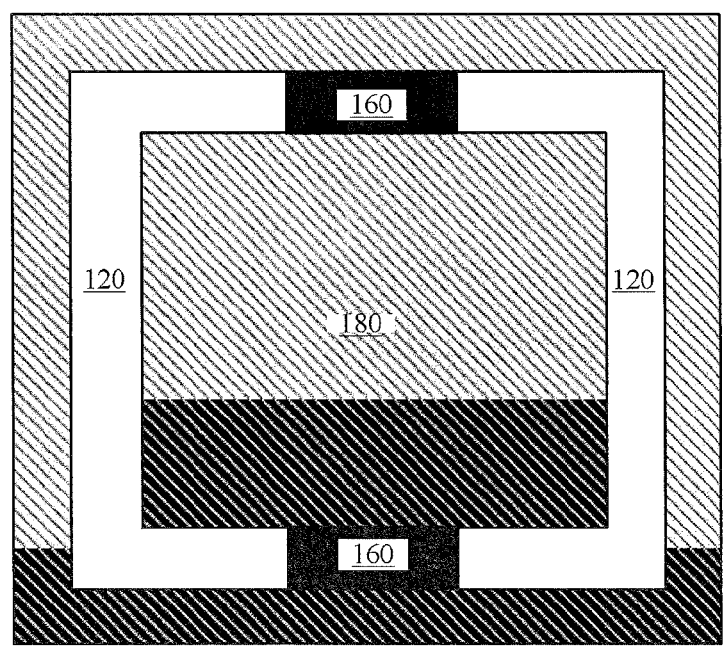
Figure 7:
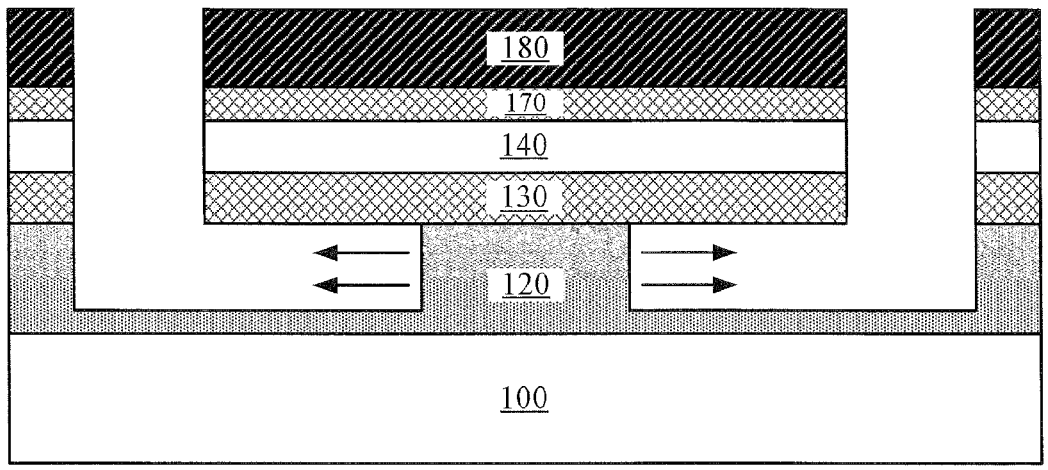
Figure 7:
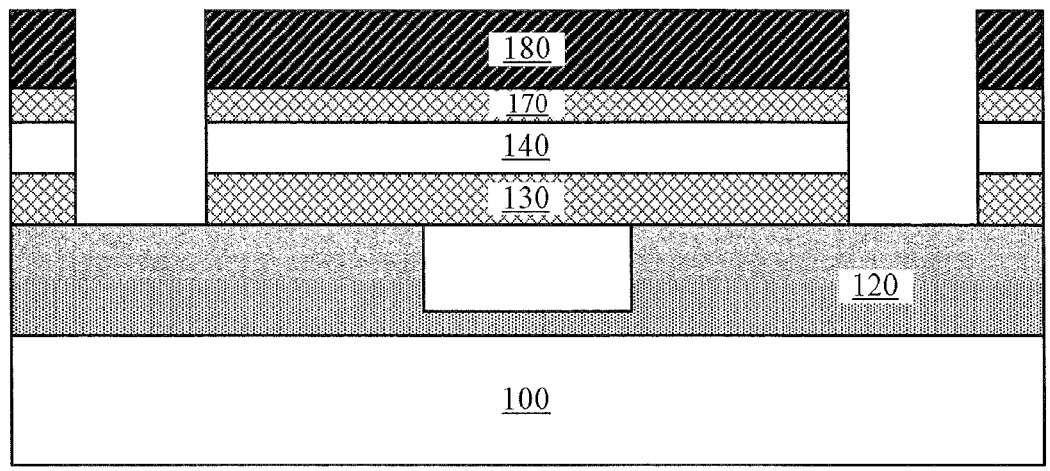
Figure 8:
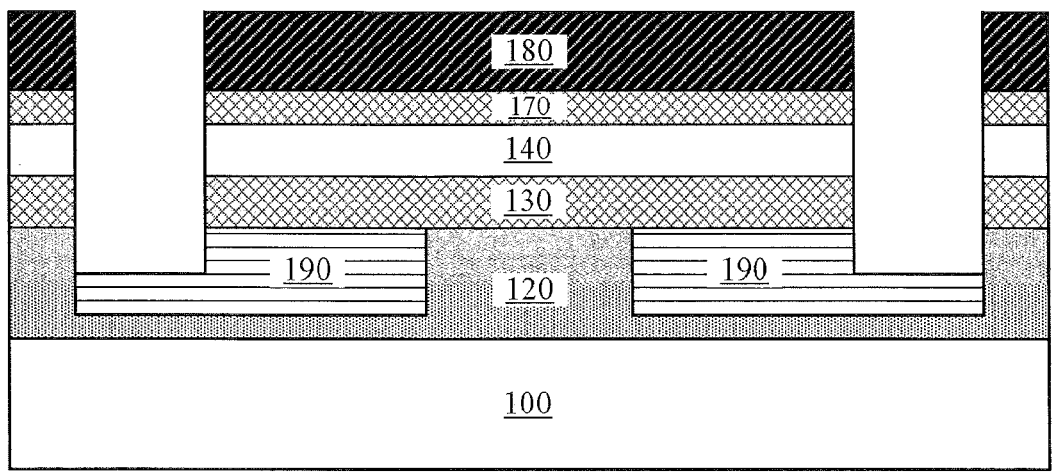
Figure 8:
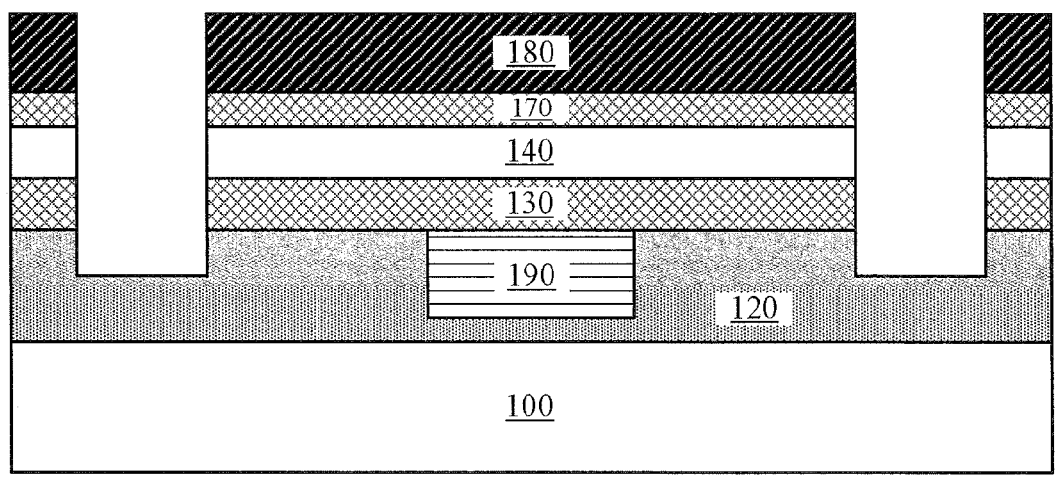
Figure 9:
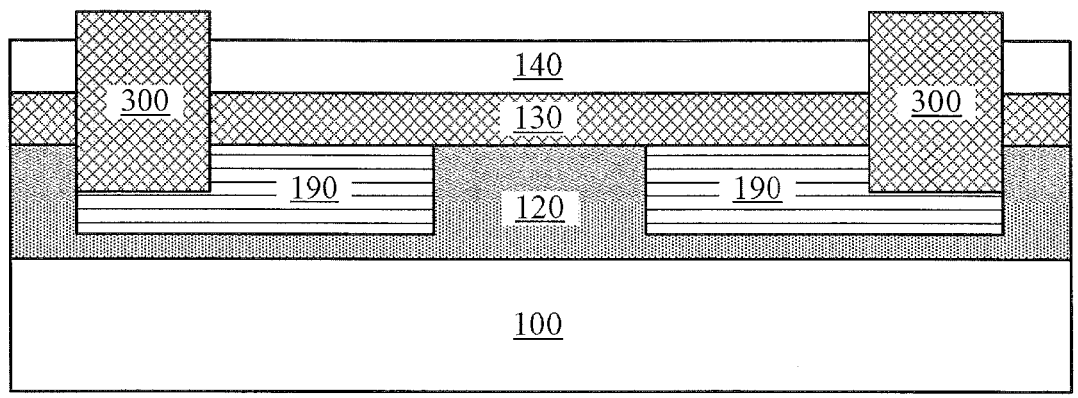
Figure 9:
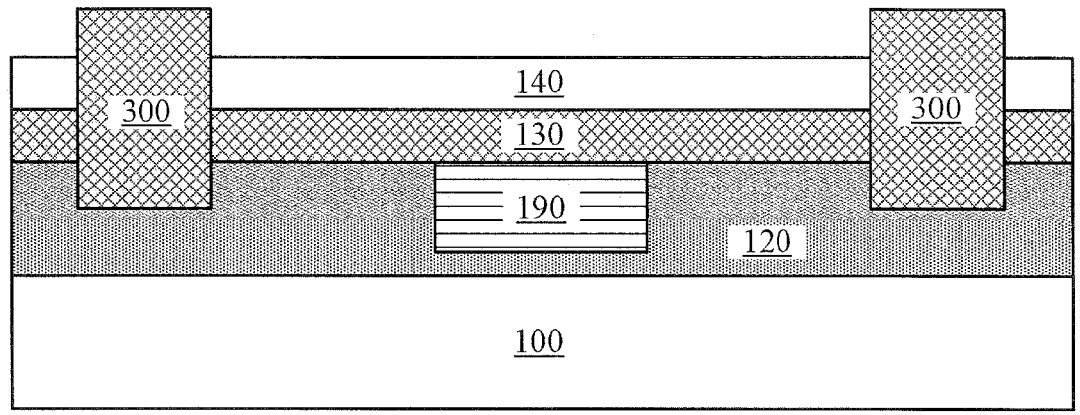
Figure 10:
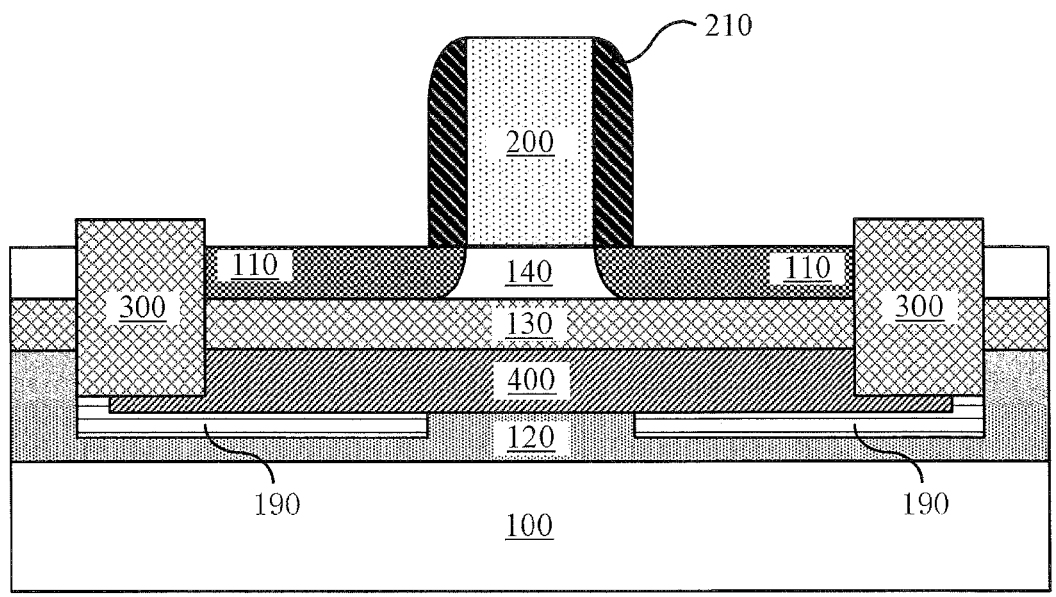
Figure 10:
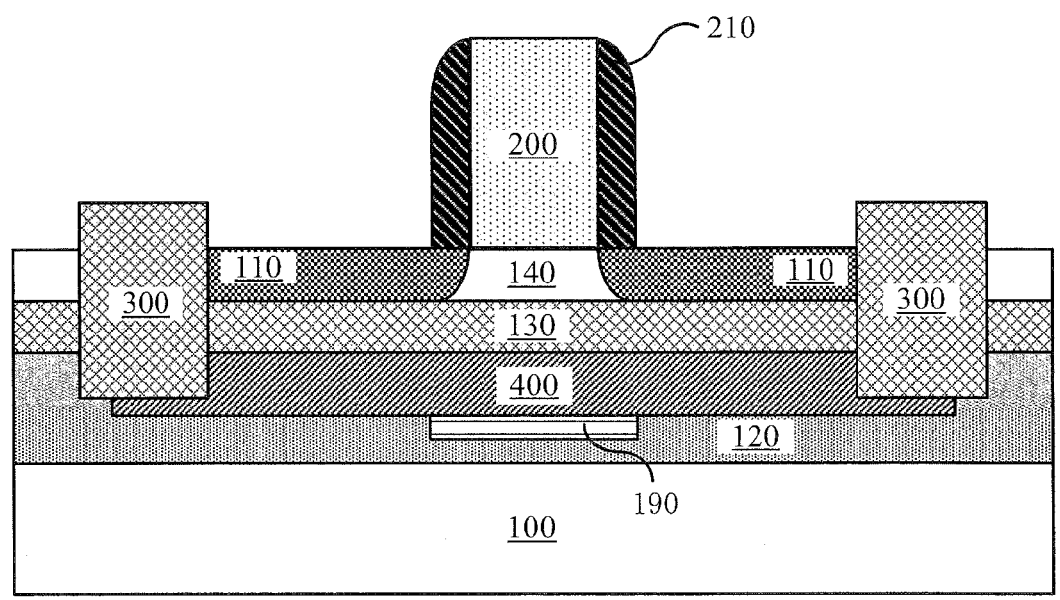
Figure 11:
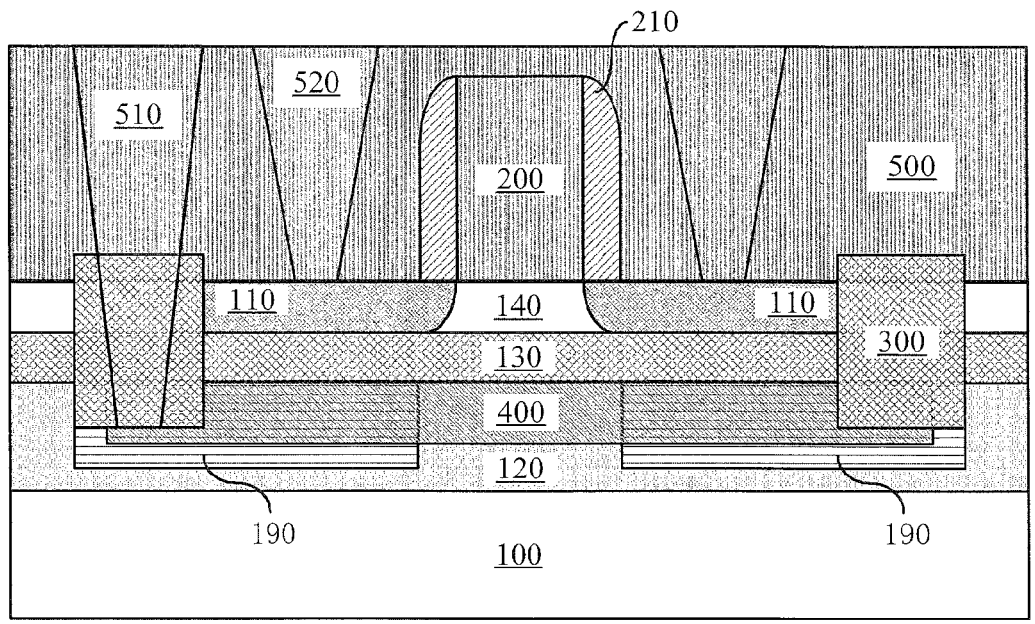
Figure 11:
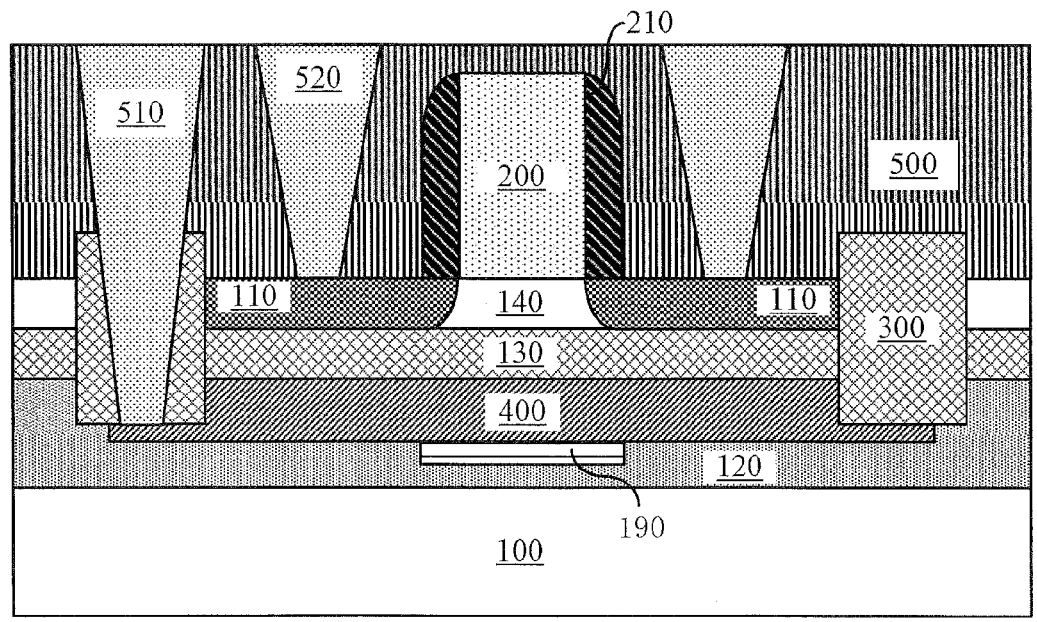

Step S101 is performed as illustrated in FIG. 2. A substrate 100 is provided, a stress layer 120 is formed on the substrate 100, a buried oxide layer 130 is formed on the stress layer 120, and an SOI layer 140 is formed on the buried oxide layer 130. In the present exemplary embodiment, the semiconductor substrate 100 comprises silicon substrate (such as a wafer). According to known design requirements of prior art (for example, P-type or N-type substrates), the semiconductor substrate 100 may comprise various doping configurations. The semiconductor substrate 100 of other examples may include other basic semiconductor, such as germanium. Alternatively, the semiconductor substrate 100 may comprise compound semiconductor, such as silicon carbide, germanium silicon, indium arsenide, or indium phosphide.

The stress layer 120 may be formed on the substrate 100 using epitaxial growth technique, preferably using silicon germanium material, which may contain 15%-30% germanium, such as 15%, 20%, or 30%. The stress layer 120 may have a thickness of about 10-100 nm, such as 10 nm, 50 nm, or 100 nm.

The buried oxide layer 130 can be formed by the methods of thermal oxidation, deposition and/or other suitable processes. The buried oxide layer 130 usually comprises oxide materials, for example, $Gd_2O_3$, $TrHfO_4$, $Nd_2O_3$, preferably $SiO_2$. The buried oxide layer 130 may have a thickness of about 5-20 nm, such as 5 nm, 13 nm, or 20 nm.

The SOI layer 140 is formed on the buried oxide layer 130 using smart-cut technique. The material of SOI layer 140 comprises monocrystalline silicon, Ge or group III-V compounds (such as SiC, gallium arsenide, indium arsenide or indium phosphide, etc.). An ultra-thin SOI layer is formed in the present disclosure. The SOI layer may have a thickness of 5-20 nm, such as 5 nm, 15 nm or 20 nm.

Step S102 is performed. A doped region of the stress layer arranged in a specific position in the stress layer is formed depending on the type of the forming semiconductor device. First, a photoresist layer 150 is applied to cover on the SOI layer 140, and then it is patterned by exposure. After patterning, a portion of the photoresist layer 150 can be etched away and then ion implantation is performed through the patterned photoresist layer. If NMOS devices are formed, as shown in FIG. 3(a), the area for construction of gate stack 200 should be covered by the photoresist layer; and if PMOS devices are formed, as shown in FIG. 3(b), the area for construction of gate stack 200 should be exposed, but both sides of the area should be covered by the photoresist layer 150. The materials of photoresist layer 150 can be vinyl monomer material, material containing azide quinone compound or polyvinyl laurate material etc.

Afterward, using arsenic or phosphorus, ion implantation is performed to the stress layer 120 through the exposed area of photoresist layer 150, forming a doped region 160 of the stress layer 120 arranged in a specific position. As shown in FIG. 4(a) and FIG. 4(b), if NMOS devices are formed, the doped region 160 of the stress layer is located on both sides of the area for gate stack 200; and if PMOS devices are formed, the doped region 160 of the stress layer is located beneath the area for gate stack 200. Then the photoresist layer 150 is removed, and the dopants in stress layer 120 are activated by annealing. The semiconductor structure formed above is annealed, for example, by laser annealing, flash annealing etc., to active dopants in the semiconductor structure. In one exemplary embodiment, an instant annealing process is used for annealing of the semiconductor structure, for example, laser annealing under high temperature of about 800-1100° C.

Step S103 is performed. An oxide layer 170 and a nitride layer 180 are sequentially formed on the SOI layer 140. A first trench is formed to penetrate the nitride layer 180, the oxide layer 170, the SOI layer 140 and the buried oxide layer 130, stopping on the upper surface of the stress layer 120. The first trench exposes at least part of the doped region 160 of the stress layer. Referring to FIG. 5(a) and FIG. 5(b), the oxide layer 170 and the nitride layer 180 are formed on the SOI layer 140. The oxide layer 170 can be formed by methods of thermal oxidation, deposition, and/or other suitable processes. This layer usually comprises oxide materials, for example, $Gd_2O_3$, $TrHfO_4$, $Nd_2O_3$, preferably $SiO_2$. The oxide layer 170 may have a thickness range of 3-10 nm, such as 3 nm, 8 nm, or 10 nm. Similarly, the nitride layer 180 can be formed by deposition method and/or other suitable processes. The nitride layer 180 may have a thickness of 50-150 nm, such as 50 nm, 120 nm, or 150 nm. This layer comprises nitride material such as $Si_3N_4$.

Photoresist patterning is performed. The first trench is formed by etching the nitride layer 180, the oxide layer 170, the SOI layer 140 and the buried oxide layer 130, and the photoresist layer is removed afterward. As in subsequent processes, an isolation region will be formed at the location of the first trench, the location and size of the first trench is dependent on the location and size of the isolation region 300. As shown in FIG. 6(a), the first trench stops at the upper surface of the doped region 160 of the stress layer. As shown in FIG. 6(b), etching of the first trench stops at the upper surface of the stress layer 120. In the case shown in FIG. 6(b), even though it only illustrates the first trench extending along the direction perpendicular to the paper sheet, it should be understood that in the direction perpendicular to the paper sheet, there may also exist a first trench extending in parallel with the paper sheet, which exposes part of the doped region 160 of the stress layer as shown in FIG. 6(c).

Step S104 is performed. A cavity is formed by etching through the first trench to remove the doped region 160 of the stress layer. The etching may be performed from the first trench formed in the previous step, as shown in FIG. 7(a) and FIG. 7(b). FIG. 7(b) shows that the etching is performed from the first trench located on the front and back sides of the device (the front side refers to the outward direction perpendicular to the paper sheet; and the back side refers to the opposite direction, which is not shown in the figure), forming a cavity in the stress layer 120. Wet etching is used here, in which selective etching of the doped silicon germanium while not etching silicon and undoped silicon germanium can be achieved by using solutions such as TMAH, KOH, or other suitable etchant solutions.

In the case shown in FIG. 7(a), after removal of the doped region 160 of the stress layer, at least part of the stress in the stress layer 120 is released, and therefore tensile stress is generated in the SOI layer 140. By introduction of the tensile stress, mobility of electrons in NMOS devices can be effectively enhanced. In the case shown in FIG. 7(b), after removal of the doped region 160 of the stress layer, at least part of the stress in the stress layer 120 is released, and therefore compressive stress is generated in the SOI layer 140. By introduction of the compressive stress, mobility of holes in PMOS devices can be effectively enhanced.

Step S105 is performed. A polycrystalline silicon region 190 of the stress layer and a second trench are formed by filling the cavity with polycrystalline silicon and etching back. As shown in FIG. 8(a), after the cavity is filled with polycrystalline silicon, the part below the first trench is etched, with etching depth less than the height of the cavity, forming the polycrystalline silicon region 190 of the stress layer and the second trench. As shown in FIG. 8(b), the cavity is filled to form the polycrystalline silicon region 190 of the stress layer. Etching of the stress layer 120 along the position of the first trench, with etching depth less than the height of the cavity, leads to formation of the second trench. The etching can be dry etching or wet etching.

Step S106 is performed. An isolation region is formed by filling the second trench. The second trench is filled with oxide, and then planarized so that the oxide is flushed with the upper surface of the nitride layer 180 (herein the term "flushed" means that the height difference of the oxide and the nitride layer 180 is within permitted error range of the process). The nitride layer 180 and the oxide layer 170 are further etched off to form the isolation region 300, as shown in FIG. 9(a) and FIG. 9(b). After removal of the two layers, tensile stress in the SOI layer 140 is further enhanced, which is helpful to reduce SCE and improve device performance.

Optionally, ion implantation is performed to the stress layer 120 from the top of the device, and then a ground layer 400 is formed after activation of dopants by annealing. The ground layer 400 can be adjacent to the buried oxide layer 130 and located in the stress layer 120 below the buried oxide layer 130. The length of the ground layer 400 can be between the spacing of inner sides and the spacing of outer sides of the isolation region 300, and should be in the center of the isolation region 300. Choice of n-type implantation or p-type implantation depends on the type of the device and the needs for increasing or decreasing device threshold voltage. For example, for pFET (p-type field-effect transistor), n-type implantation or p-type implantation may be used; for nFET (n-type field-effect transistor), p-type implantation or n-type implantation may be used. The process of annealing to activate dopants is described earlier in the present disclosure; hence it will not be described again.

Afterward, a gate stack 200 can be formed on the above mentioned semiconductor structure. The process of constructing the gate stack 200 includes: formation of a gate dielectric layer covering the SOI layer 140 and the isolation region 300, a gate metal layer covering the gate dielectric layer, a gate electrode layer covering the gate metal layer, an oxide layer covering the gate electrode layer, a nitride layer covering the oxide layer, and a photoresist layer covering the nitride layer for patterning and etching of the gate stack. The material of the gate dielectric layer can be thermal oxide layer, comprising silicon oxide, silicon oxynitride, and also high K dielectric, such as $HfO_2$, HfSiO, HfSiON, HfTaO, HfTiO, HfZrO, $Al_2O_3$, $La_2O_3$, $ZrO_2$, LaAlO or combinations thereof, with a thickness of about 1 nm-4 nm; the material of the gate metal layer can be chosen from TaC, TiN, TaTbN, TaErN, TaYbN, TaSiN, HfSiN, MoSiN, $RuTa_x$, NiTa or combinations thereof, with a thickness range of 5 nm-20 nm; the material of the gate electrode layer can be Poly-Si, with a thickness range of 20 nm-80 nm; the material of the oxide layer can be $SiO_2$, with a thickness range of 5 nm-10 nm; the material of the nitride layer can be $Si_3N_4$, with a thickness range of 10 nm-50 nm; and the materials of the photoresist layer can be vinyl monomer material, material containing azide quinone compound or polyvinyl laurate material etc. In the above mentioned multiple layer structure, except for the photoresist layer, all other layers can be formed sequentially on the SOI layer 100 by Chemical Vapor Deposition (CVD), high density plasma CVD, Atomic Layer Deposition (ALD), Plasma Enhanced ALD (PEALD), Pulsed Laser Deposition (PLD) or other suitable methods. After patterning of the photoresist layer, the above mentioned multiple layer structure can be etched to form the gate structure 200 (a gate line is formed on the SOI substrate). Generally, a sidewall spacer 210 may be formed on both sides of the gate structure 200 to isolate the gate structure 200. The sidewall spacer 210 may be formed of silicon nitride, silicon oxide, silicon oxynitride, silicon carbide and/or other suitable materials. The sidewall spacer 210 may have multiple layers, and may be formed by deposition-etching process, with a thickness of about 10 nm-100 nm.

Optionally, a source/drain extension region may be formed by shallow doping to the SOI layer 140 on both sides of the gate stack 200 before the formation of the sidewall spacer 210. A Halo implantation region may also be formed by halo implantation. The dopant type in shallow doping is consistent with the device type, whereas the dopant type in Halo implantation is opposite to the device type.

An S/D region 110 is further formed by implantation of P-type or N-type dopants or impurities into substrate 100. For example, the S/D region 110 can be P-type doped for PMOS, whereas the S/D region 110 can be N-type doped for NMOS. The S/D region 110 may be formed by methods of lithography, ion implantation, diffusion and/or other suitable processes. In the present embodiment, the S/D region 110 is located in the SOI layer 140. In some other embodiments, the S/D region 110 may be a raised S/D structure formed by selective epitaxial growth, where the top of the epitaxial part is higher than the bottom of the gate stack 200 (in the present disclosure, the bottom of the gate stack refers to the boundary line between the gate stack 200 and the SOI layer 140), as shown in FIG. 10(a) and FIG. 10(b).

Optionally, contact plugs 510 and 520 can be further formed with the method provided in the present disclosure, which comprises: forming dielectric layer 500 covering the gate structure 200 and the SOI layer 140, and in the dielectric layer 500, subsequently forming the first contact hole exposing at least part of the ground layer 400, and the second contact hole exposing at least part of the S/D region 110, respectively. The dielectric layer 500 can be formed by CVD, high density plasma CVD, spin coating or other suitable methods. The material of the dielectric layer 500 may comprise SiO2, carbon doped SiO2, BPSG, PSG, UGS, silicon oxynitride, low k material or combinations thereof. After a CMP process is performed on the dielectric layer 500, usually the dielectric layer 500 may have a thickness of about 40 nm-150 nm, such as 80 nm, 100 nm, or 120 nm. The first contact hole, penetrating the dielectric layer 500 and the isolation region 300, stops at the ground layer 400 and exposes at least part of the ground layer 400. The second contact hole, penetrating the dielectric layer 500 above the S/D region 110, exposes at least part of the S/D region 110. In a process for formation of the first contact hole and the second contact hole by etching of the dielectric layer 500 applying dry etching, wet etching or other suitable etching methods, the upper surface of the ground layer 400 can be treated as the stop layer for etching of the first contact hole, while the upper surface of the S/D region 110 can be treated as the stop layer for etching of the second contact hole, thus loosening the requirements on process control of etching, and lowering the difficulty of etching. During subsequent processes, usually the first contact hole and the second contact hole are filled with metals to form the first contact plug 510 and the second contact plug 520, as shown in FIG. 11(a) and FIG. 11(b). Preferably, the filled metal is W. Certainly, according to requirements for manufacturing semiconductor devices, the material of the filled metal may be chosen from W, Al, TiAl alloy, or combinations thereof.

Since the present disclosure provides several preferred structures of a semiconductor structure, one preferred structure is provided and described below.

Refer to FIG. 10(a), FIG. 10(a) illustrates a semiconductor structure corresponding to NMOS device, comprising: a substrate 100, a stress layer 120, a buried oxide layer 130, an SOI layer 140, an S/D region 110, a polycrystalline silicon region 190 of the stress layer, and a gate stack 200, wherein:

The gate stack 200 is formed on the SOI layer 140;

The S/D region 110 is formed in the SOI layer 140 and is located on both sides of the gate stack 200;

The stress layer 120, the buried oxide layer 130, and the SOI layer 140 are sequentially formed on the substrate 100;

For an NMOS device, the polycrystalline silicon region 190 of the stress layer is located in the stress layer 120 on both sides of the gate stack 200.

Refer to FIG. 10(b), FIG. 10(b) illustrates a semiconductor structure corresponding to a PMOS device, of which the difference from the semiconductor structure shown in FIG. 10(a) is the polycrystalline silicon region 190 of the stress layer is located in the stress layer 120 beneath the gate stack 200.

Optionally, the two semiconductor structures mentioned above also comprise the sidewall spacer 210 formed on both sides of the gate stack 200.

Preferably, the material of the stress layer 120 is silicon germanium, of which the germanium content is 15%-30%.

The stress layer 120 may have a thickness of 10-100 nm, such as 10 nm, 50 nm, 100 nm. The buried oxide layer 130 may have a thickness of 5-20 nm, such as 5 nm, 10 nm, 20 nm. The SOI layer 140 may have a thickness of 5-20 nm, such as 5 nm, 12 nm, 20 nm. The oxide layer 170 may have a thickness of 3-10 nm, such as 3 nm, 6 nm, 10 nm. The nitride layer 180 may have a thickness of 50-150 nm, such as 50 nm, 110 nm, 150 nm.

Optionally, the semiconductor structure also comprises a ground layer 400, which is adjacent to the buried oxide layer 130 but located in the stress layer 120 beneath the buried oxide layer 130 and is n-type or p-type doped.

Optionally, the semiconductor structure also comprises: a dielectric layer 500, a first contact plug 510 and a second contact plug 520, wherein: the dielectric layer 500 covers the SOI layer 140, the isolation region 300, and the interlayer dielectric layer 500 of the gate structure 200; the first contact plug 510 penetrates the dielectric layer 500 and the isolation region 300, and is in contact with the ground layer 400; and the second contact plug 520 penetrates the dielectric layer 500, and is in contact with the S/D region 110.

Applying the manufacturing method provided in the present disclosure, SCE of devices can be effectively reduced and the performance of the devices can be improved by introduction of stress.

While the exemplary embodiment and its advantages have been described in detail, it should be understood that without deviating from the spirit of the invention and the scope of protection defined in the appended claims, various changes, substitutions and modifications can be made to these embodiments. For other examples, people skilled in the art should easily understand that without deviating from the scope of protection of the present disclosure, the order of process steps may be changed.

Additionally, the scope of application of the present disclosure is not limited to the processes, organization, manufacturing, material composition, means, methods and steps described herein for the particular embodiments. From the disclosure of the present invention, people skilled in the art may easily understand, for the processes, organization, manufacturing, material composition, means, methods or steps that are currently existing or to be developed later, they can be used in accordance with the present disclosure, to execute virtually the same functions as the embodiments described in the present disclosure or to achieve virtually the same results. Accordingly, the appended claims of the present disclosure seek to include these processes, organization, manufacturing, material composition, means, methods or steps in the scope of protection.

We claim:

1. A method for manufacturing a semiconductor structure, comprising:
    a) providing a substrate, and sequentially forming a stress layer, a buried oxide layer, and an SOI layer on the substrate;
    b) forming a doped region of the stress layer arranged in a specific position in the stress layer according to a type of a semiconductor device to be formed;
    c) sequentially forming an oxide layer and a nitride layer on the SOI layer, and forming a first trench that penetrates the nitride layer, the oxide layer, the SOI layer and the buried oxide layer and stops on an upper surface of the stress layer, where the first trench exposes at least part of the doped region of the stress layer;
    d) forming a cavity by etching through the first trench to remove the doped region of the stress layer;
    e) forming a polycrystalline silicon region of the stress layer and a second trench by filling the cavity with polycrystalline silicon and etching back the polycrystalline silicon; and
    f) forming an isolation region by filling the second trench.

2. The method according to claim 1, wherein after step f), the method further comprises forming a ground layer in the stress layer and in the polycrystalline silicon region of the stress layer.

3. The method according to claim 1, wherein in step b) if NMOS devices are formed, the doped region of the stress layer is located within the stress layer on both sides of the area below the channel region of the semiconductor devices formed in the SOI layer.

4. The method according to claim 1, wherein in step b) if PMOS devices are formed, the doped region of the stress layer is located within the stress layer directly beneath the channel region of the semiconductor devices formed in the SOI layer.

5. The method according to claim 1, wherein in step b) the doping type of the doped region of the stress layer is n-type.

6. The method according to claim 1, wherein the SOI layer is formed by smart-cut.

7. The method according to claim 2, wherein the ground layer is formed by ion implantation and annealing processes.

8. The method according to claim 1, wherein the material of the stress layer is silicon germanium.

9. The method according to 8, wherein the germanium content in the stress layer is 15%-30%.

10. The method according to claim 1, wherein after step f) the method further comprises removing the oxide layer and the nitride layer.

11. The method according to claim 1, wherein after step f) the method further comprises forming a gate stack located on the SOI layer and an S/D region located on both sides of the gate stack.

12. A semiconductor structure, comprising: a substrate, a stress layer, a buried oxide layer, an SOI layer, an S/D region, a polycrystalline silicon region of the stress layer, and a gate stack, wherein:
    the gate stack is formed on the SOI layer;
    the S/D region is formed in the SOI layer and located on both sides of the gate stack;
    the stress layer, the buried oxide layer and the SOI layer are formed sequentially on the substrate;
    the polycrystalline silicon region of the stress layer is located in the stress layer of both PMOS and NMOS semiconductor device;
    for an NMOS semiconductor device, the polycrystalline silicon region of the stress layer is located in the stress layer on both sides of the gate stack; and
    for a PMOS semiconductor device, the polycrystalline silicon region of the stress layer is located in the stress layer beneath the gate stack.

13. The structure according to claim 12, further comprising a ground layer which is adjacent to the buried oxide layer, and located in the stress layer beneath the buried oxide layer.

14. The structure according to claim 13, wherein the doping type of the ground layer is n-type or p-type.

15. The structure according to claim 12, wherein the material of the stress layer is silicon germanium.

16. The structure according to claim 15, wherein the content of germanium in the stress layer is 15%-30%.

* * * * *